(12) United States Patent
Hashiguchi et al.

(10) Patent No.: US 10,673,332 B2
(45) Date of Patent: Jun. 2, 2020

(54) SWITCHING REGULATOR

(71) Applicant: Rohm Co., Ltd., Kyoto (JP)

(72) Inventors: Shingo Hashiguchi, Kyoto (JP); Tetsuo Tateishi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 16/314,475

(22) PCT Filed: Aug. 2, 2017

(86) PCT No.: PCT/JP2017/028004
§ 371 (c)(1),
(2) Date: Dec. 31, 2018

(87) PCT Pub. No.: WO2018/025901
PCT Pub. Date: Feb. 8, 2018

(65) Prior Publication Data
US 2019/0319536 A1    Oct. 17, 2019

(30) Foreign Application Priority Data
Aug. 4, 2016   (JP) ................................. 2016-153908

(51) Int. Cl.
*H02M 3/156*      (2006.01)
*G01R 19/00*      (2006.01)
(Continued)

(52) U.S. Cl.
CPC ........ *H02M 3/156* (2013.01); *G01R 19/0092* (2013.01); *G05F 1/10* (2013.01);
(Continued)

(58) Field of Classification Search
CPC ....... H02M 3/158; H02M 3/156; H02M 3/155
(Continued)

(56) References Cited

U.S. PATENT DOCUMENTS 7,764,054 B1   7/2010  Guo et al.
8,482,267 B2 *  7/2013  Noda ................... H02M 3/158
                                              323/282
(Continued)

FOREIGN PATENT DOCUMENTS

CN       101828327       9/2010
CN       103683918       3/2014
(Continued)

OTHER PUBLICATIONS

Japan Patent Office, International Search Report for PCT/JP2017/028004 dated Oct. 17, 2017 with English translation.
(Continued)

*Primary Examiner* — Nguyen Tran
(74) *Attorney, Agent, or Firm* — Fish & Richardson P.C.

(57) ABSTRACT

A switching regulator control circuit, having: a slope circuit 3 for generating a slope voltage $V_{SLP}$ on the basis of a clock signal CLK of a prescribed frequency; an error amplifier 1 for generating an error signal Vc corresponding to the difference between a reference voltage $V_{REF}$ and a voltage $V_{FB}$ corresponding to the output voltage of a switching regulator; a comparator 4 for comparing the error signal Vc and the slope voltage $V_{SLP}$; and an RS flip-flop 6 set on the basis of the clock signal CLK and reset by a signal outputted by the comparator 4. The timing at which the RS flip-flop 6 is set is delayed with respect to the timing at which the sloping of the slope voltage $V_{SLP}$ is started.

11 Claims, 7 Drawing Sheets

(51) Int. Cl.
*G05F 1/10* (2006.01)
*G06F 1/26* (2006.01)
*H02M 3/335* (2006.01)
*H02M 1/00* (2006.01)

(52) U.S. Cl.
CPC .......... *G06F 1/26* (2013.01); *H02M 3/33569* (2013.01); *H02M 2001/0009* (2013.01); *H02M 2001/0025* (2013.01); *H03F 2200/351* (2013.01)

(58) Field of Classification Search
USPC .......................................... 323/271, 282–285
See application file for complete search history.

(56) References Cited

U.S. PATENT DOCUMENTS

| | | | |
|---|---|---|---|
| 2009/0072807 A1* | 3/2009 | Qiu | H02M 3/156 323/285 |
| 2010/0066333 A1 | 3/2010 | Noda | |
| 2011/0133711 A1* | 6/2011 | Murakami | H03K 17/0822 323/282 |
| 2011/0199062 A1 | 8/2011 | Singnurkar | |
| 2012/0274296 A1 | 11/2012 | Higuchi et al. | |
| 2013/0038310 A1 | 2/2013 | Menegoli et al. | |
| 2013/0162230 A1* | 6/2013 | Miyamae | G05F 1/46 323/271 |
| 2014/0085949 A1 | 3/2014 | Sugawara | |
| 2016/0172978 A1 | 6/2016 | Fukumoto | |

FOREIGN PATENT DOCUMENTS

| | | |
|---|---|---|
| JP | 2009-219179 | 9/2009 |
| JP | 2010-220355 | 9/2010 |
| JP | 2016-116369 | 6/2016 |
| WO | WO 2009/110289 | 9/2009 |

OTHER PUBLICATIONS

European Patent Office; Extended European Search Report mailed in counterpart European Application No. 17837003.7 (Jan. 24, 2020).

* cited by examiner

SWITCHING REGULATOR

TECHNICAL FIELD

The present invention relates to power supply devices, and in particular to switching regulators.

BACKGROUND ART

Switching regulators are widely used in various electronic apparatuses to supply appropriate voltage to electronic circuits used inside the electronic apparatuses. Switching regulators each have a switching regulator control circuit which generates a switching signal for controlling the turning on/off of a switching element.

As a control method for the switching regulator control circuit, PWM control methods are widely used (see, for example, Patent Document 1). In a switching regulator control circuit employing a PWM control method, a latch portion is set by a clock signal, and is reset by a PWM (Pulse Width Modulation) signal, which is a result of comparison between an error signal and a slope voltage, and a switching signal is outputted from the latch portion.

CITATION LIST

Patent Literature

[Patent Literature 1] Japanese Patent Application Publication No. 2010-220355

SUMMARY OF INVENTION

Technical Problem

Unfortunately, however, switching regulator control circuits employing the conventional PWM control methods are not able to sufficiently shorten the minimum pulse width, or the minimum on-time, of the switching signal outputted from the latch portion. As a result, in a step-down switching regulator having a switching regulator control circuit employing a conventional PWM control method, it is impossible to make the maximum value of the range of such input voltages as can be stepped down to a target value of output voltage sufficiently large.

The present invention has been made in view of such circumstances, and an object of the present invention is to provide a switching regulator control circuit that employs a PWM control method and is capable of shortening the minimum on-time, and a switching regulator and a vehicle including such switching regulator control circuit.

Solution to Problem

A switching regulator control circuit disclosed herein includes a slope voltage generator configured to generate a slope voltage based on a clock signal of a predetermined frequency, an error amplifier configured to generate an error signal corresponding to a difference between a voltage corresponding to an output voltage of a switching regulator and a reference voltage, a first comparator configured to compare the slope voltage with the error signal, and a latch portion configured to be set based on the clock signal and is reset by an output signal of the first comparator. Here, a timing at which the latch portion is set is delayed with respect to a timing at which sloping of the slope voltage starts (first configuration).

The switching regulator control circuit having the first configuration may further include a delay portion to which the clock signal is fed, and an output signal of the delay portion may be fed to a set terminal of the latch portion (second configuration).

In the switching regulator control circuit having the second configuration, the delay portion may be a second comparator configured to compare the clock signal with a predetermined voltage (third configuration).

In the switching regulator control circuit having the third configuration, the predetermined voltage may be the error signal (fourth configuration).

In the switching regulator control circuit having the third configuration, the predetermined voltage may be a constant voltage (fifth configuration).

In the switching regulator control circuit having any one of the first to fifth configurations, the slope voltage generator may receive a result of detection performed by a current detector configured to detect a current flowing in an inductor which is provided in the switching regulator, and the slope voltage may be a voltage corresponding to the result of detection performed by the current detector (sixth configuration).

In the switching regulator control circuit having the first configuration, the latch portion may be set at one of a first inversion timing at which the clock signal is inverted from low level to high level and a second inversion timing at which the clock signal is inverted from high level to low level, and the sloping of the slope voltage may start at the other of the first inversion timing and the second inversion timing (seventh configuration).

A switching regulator disclosed herein includes the switching regulator control circuit having any one of the first to seventh configuration, and a switching element configured to be turned on/off by the switching regulator control circuit (eighth configuration).

A vehicle disclosed herein has the switching regulator having the eighth configuration, and a battery configured to supply power to the switching regulator (ninth configuration).

Advantageous Effects of Invention

According to a switching regulator control circuit employing a PWM control method, and a switching regulator and a vehicle including the same, which are disclosed herein, it is possible to shorten the minimum pulse width, or the minimum on-time, of the switching signal.

DESCRIPTION OF EMBODIMENTS

First Embodiment

Figure 1:
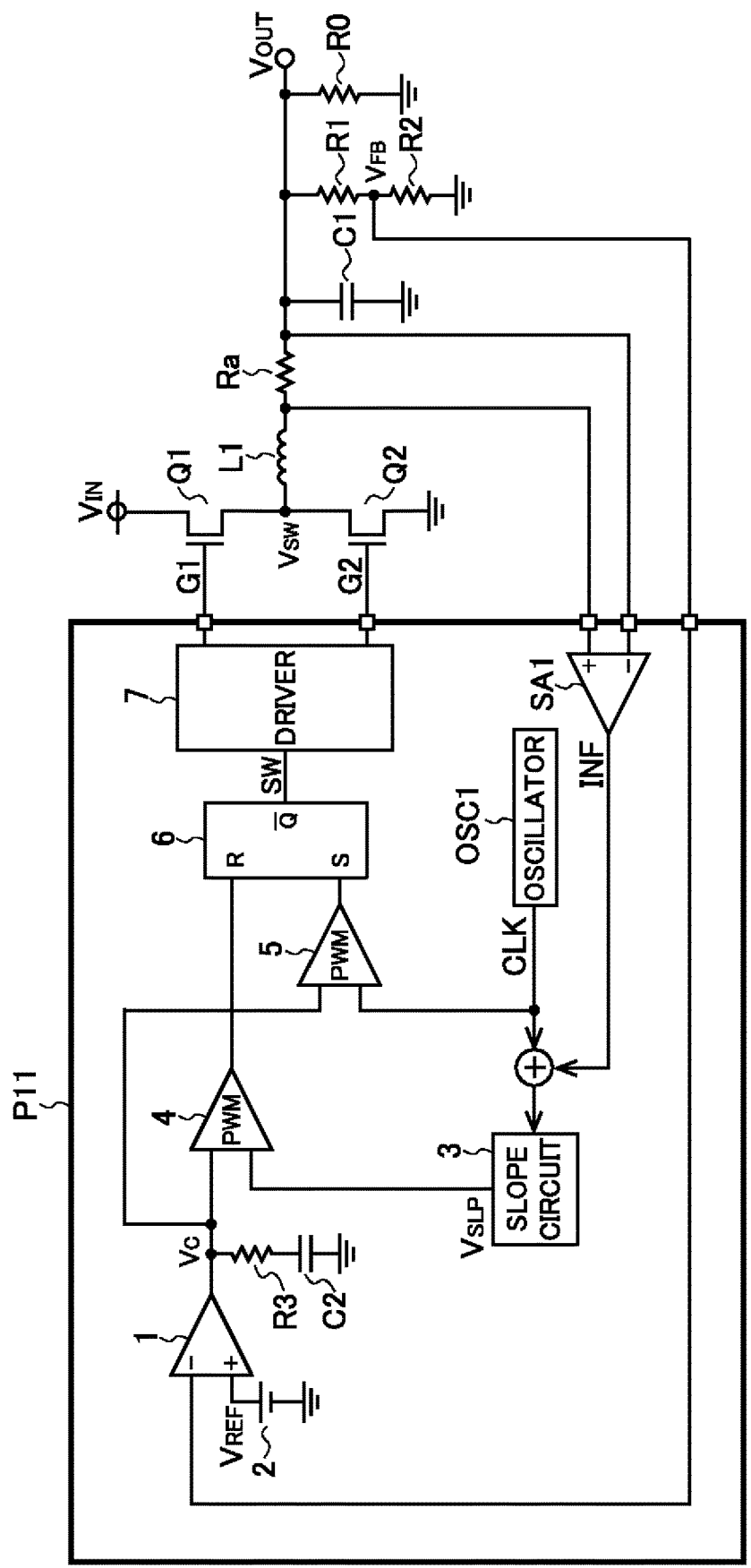
FIG. 1 is a diagram illustrating a configuration of a first embodiment of a switching regulator.

FIG. 1 is a diagram illustrating a configuration of a switching regulator of a first embodiment. A switching regulator 101 according to the first embodiment is a step-down switching regulator, and includes a semiconductor integrated circuit package P11, MOS transistors Q1 and Q2, an inductor L1, an output capacitor C1, an output resistor R0, voltage dividing resistors R1 and R2, and a current detecting resistor Ra.

The MOS transistor Q1 is an N-channel type MOS transistor, and is an example of a switch for switching between a conducting state and a cut-off state of a current path leading from an input voltage application terminal, to which an input voltage $V_{IN}$ is applied, to one terminal of the inductor L1. A drain of the MOS transistor Q1 is connected to the input voltage application terminal, to which the input voltage $V_{IN}$ is applied. A source of the MOS transistor Q1 is connected to the one terminal of the inductor L1 and to a drain of the MOS transistor Q2.

The MOS transistor Q2 is an N-channel type MOS transistor, and is an example of a switch for switching between a conducting state and a cut-off state of a current path leading from a ground terminal to the one terminal of the inductor L1. A drain of the MOS transistor Q2 is, as mentioned above, connected to the one terminal of the inductor L1 and to the source of the MOS transistor Q1. A source of the MOS transistor Q2 is connected to the ground terminal. Here, it is possible to use a diode instead of the MOS transistor Q2.

The other end of the inductor L1 is connected, via the current detecting resistor Ra, to an output voltage application terminal, to which an output voltage $V_{OUT}$ is applied.

The output capacitor C1 is a smoothing capacitor for reducing ripples in the output voltage $V_{OUT}$. The output voltage $V_{OUT}$ undergoes phase compensation performed by a phase compensation circuit composed of the output capacitor C1 and the output resistor R0.

The voltage dividing resistors R1 and R2 divide the output voltage $V_{OUT}$ to thereby generate a feedback voltage $V_{FB}$, and the feedback voltage $V_{FB}$ is supplied to the semiconductor integrated circuit package P11.

The semiconductor integrated circuit package P11 includes a switching regulator control circuit and a driver 7. The switching regulator control circuit is composed of an error amplifier 1, a reference voltage source 2, a resistor R3, a capacitor C2, a slope circuit 3, comparators 4 and 5, an RS flip-flop 6, a current detecting amplifier SA1, and an oscillator OSC1, and generates a switching signal SW for controlling the turning on/off of the MOS transistors Q1 and Q2.

The oscillator OSC1 generates a clock signal CLK of a predetermined frequency (2 MHz, for example). The current detecting amplifier SA1 generates an information signal INF by amplifying a potential across terminals of the current detecting resistor Ra. The information signal INF is a signal having current information of a current flowing in the inductor L1.

The error amplifier 1 generates an error signal corresponding to a difference between the feedback voltage $V_{FB}$ and a reference voltage $V_{REF}$, which is outputted from the reference voltage source 2. The error signal undergoes phase compensation performed by a phase compensation circuit composed of the resistor R3 and the capacitor C2.

The slope circuit 3 is controlled based on the clock signal CLK, receives the information signal INF outputted from the current detecting amplifier SA1 to thereby have the current information of the inductor L1, and generates, to output, a slope voltage $V_{SLP}$ in which the current information of the inductor L1 is reflected. Specifically, each time the clock signal CLK is switched from high level to low level, the slope circuit 3 initializes the slope voltage $V_{SLP}$ and makes the time a timing at which sloping of the slope voltage $V_{SLP}$ starts. In this way, the switching regulator 101 serves as what is called a current-mode control switching regulator. In the present embodiment, the current information of the inductor L1 is reflected in the slope of the slope voltage $V_{SLP}$, but the current information of the inductor L1 may be reflected in an offset amount of the slope voltage $V_{SLP}$, instead.

The comparator 4 compares an error signal Vc having undergone phase compensation with the slope voltage $V_{SLP}$, and thereby generates a reset signal, which is a comparison signal. The slope voltage $V_{SLP}$ has a fixed period, and thus the reset signal is a PWM signal. With the slope voltage $V_{SLP}$ being greater than the error signal Vc having undergone the phase compensation, the reset signal is at high level, while with the slope voltage $V_{SLP}$ being equal to or smaller than the error signal Vc having undergone the phase compensation, the reset signal is at low level. However, in the comparator 4, there is an inevitable delay from when the level relation between the error signal Vc having undergone the phase compensation and the slope voltage $V_{SLP}$ is switched until when the level of the output signal (the reset signal) is switched.

The comparator 5 compares the error signal Vc having undergone the phase compensation with the clock signal CLK, and thereby generates a set signal, which is a comparison signal. When the clock signal CLK is greater than the error signal Vc having undergone the phase compensation, the set signal becomes high level, while when the clock signal CLK is equal to or smaller than the error signal Vc having undergone the phase compensation, the set signal becomes low level. However, in the comparator 5, there is an inevitable delay from when the level relation between the error signal Vc having undergone the phase compensation and the clock signal CLK is switched until when the level of the output signal (the set signal) is switched.

The reset signal outputted from the comparator 4 is supplied to a reset terminal of the RS flip-flop 6, and the set signal outputted from the comparator 5 is supplied to a set terminal of the RS flip-flop 6.

The RS flip-flop 6 switches the switching signal SW from low level to high level when the set signal is switched from high level to low level, and switches the switching signal SW from high level to low level when the reset signal is switched from low level to high level. The switching signal SW is outputted from an inverting output terminal of the RS flip-flop 6.

The driver 7 generates a gate signal G1 of the MOS transistor Q1 and a gate signal G2 of the MOS transistor Q2 based on the switching signal SW, drives the MOS transistor Q1 with the gate signal G1, and drives the MOS transistor Q2 with the gate signal G2. As a result, the MOS transistors Q1 and Q2 are turned on/off complementarily; when the switching signal SW is at high level, a switch voltage $V_{SW}$ generated at a connection point between the MOS transistors Q1 and Q2 becomes high level, and when the switching signal SW is at low level, the switch voltage $V_{SW}$ becomes low level. Here, it is preferable that, at a time when the MOS transistors Q1 and Q2 are turned on/off, a dead time be provided, during which the MOS transistors Q1 and Q2 are both OFF.

Comparison Between First Embodiment and Comparative Example

Figure 2:
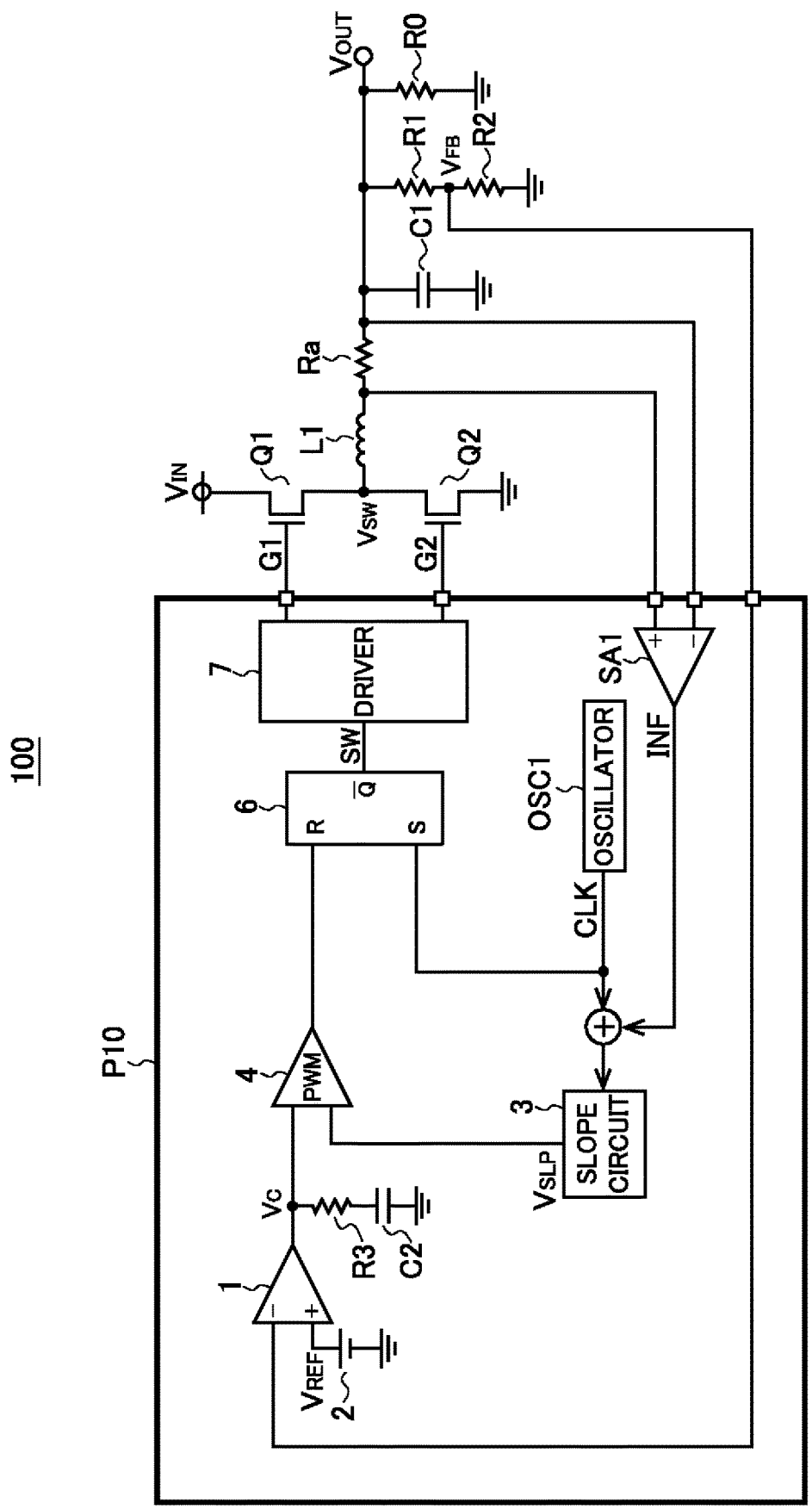
FIG. 2 is a diagram illustrating a configuration of a comparative example of the switching regulator.

Next, the switching regulator 101 according to the first embodiment described above will be compared with a switching regulator 100 according to a comparative example illustrated in FIG. 2.

The switching regulator 101 according to the first embodiment and the switching regulator 100 according to the comparative example are different from each other only in terms of the configuration of the semiconductor integrated circuit package. Specifically, a semiconductor integrated circuit package P10 in the switching regulator 100 according to the comparative example has a configuration obtained by removing the comparator 5 from the semiconductor integrated circuit package P11 in the switching regulator 101 according to the first embodiment. Accordingly, in the switching regulator 100 according to the comparative example, the clock signal CLK is supplied to the set terminal of the RS flip-flop 6.

Figure 3:
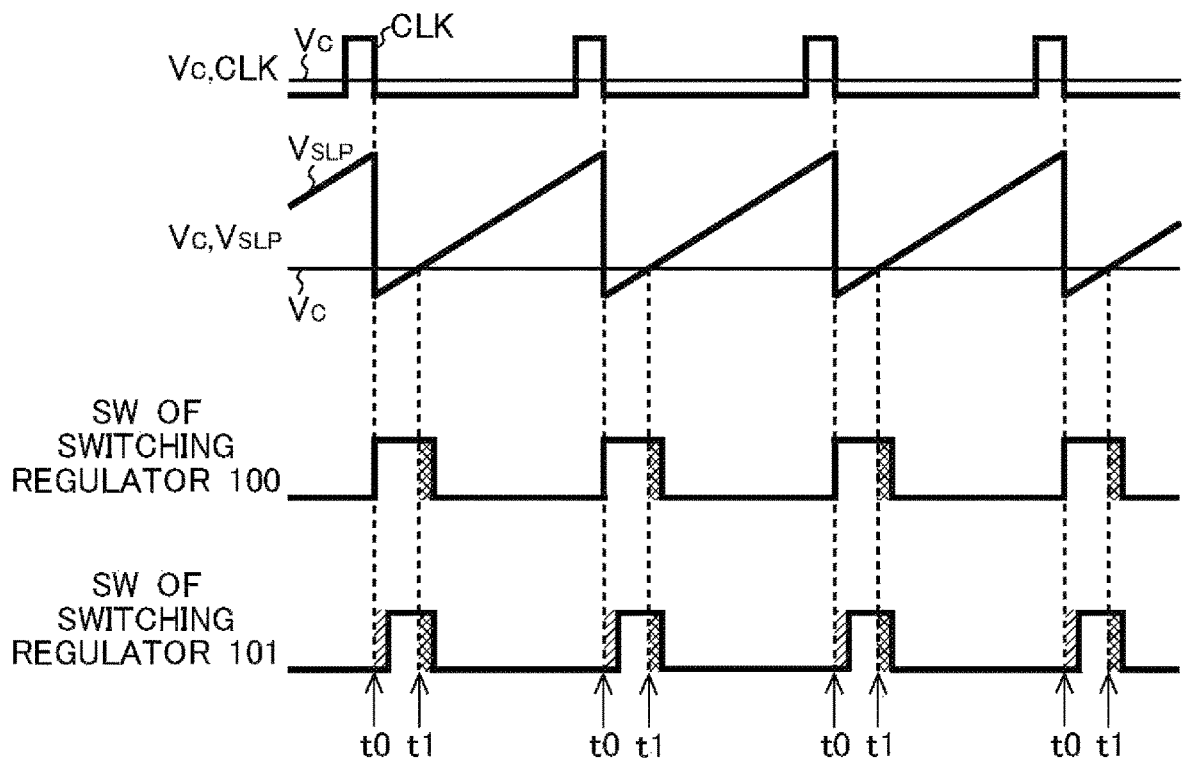
FIG. 3 is a time chart illustrating operations of the switching regulators illustrated in FIG. 1 and FIG. 2.

FIG. 3 is a time chart illustrating an operation of the switching regulator 101 according to the first embodiment and an operation of the switching regulator 100 according to the comparative example.

In the switching regulator 100 according to the comparative example, due to the delay at the comparator 4, the switching signal SW is switched from high level to low level with a delay of an amount indicated by a double-hatched part in FIG. 3 from time point t1 at which the level relation between the error signal Vc having undergone the phase compensation and the slope voltage $V_{SLP}$ is switched such that the slope voltage $V_{SLP}$ becomes greater than the error signal Vc having undergone the phase compensation. That is, in the switching regulator 100 according to the comparative example, the switching signal SW has a pulse width that is wider by the amount indicated by the double hatched part in FIG. 3, and thus it is impossible to shorten the minimum pulse width, or the minimum on-time, of the switching signal SW.

In the switching regulator 101 according to the first embodiment, too, like in the switching regulator 100 according to the comparative example, due to the delay at the comparator 4, the switching signal SW is switched from high level to low level with a delay of an amount indicated by a double-hatched part in FIG. 3 from time point t1 at which the level relation between the error signal Vc having undergone the phase compensation and the slope voltage $V_{SLP}$ is switched such that the slope voltage $V_{SLP}$ becomes greater than the error signal Vc having undergone the phase compensation.

However, in the switching regulator 101 according to the first embodiment, due to the delay at the comparator 5, the switching signal SW is switched from low level to high level with a delay of an amount indicated by a diagonally-hatched part in FIG. 3 from time point t0 at which the level relation between the error signal Vc having undergone the phase compensation and the clock signal CLK is switched such that the clock signal CLK becomes equal to or smaller than the error signal Vc having undergone the phase compensation. Accordingly, in the switching regulator 101 according to the first embodiment, it is possible to reduce the increase of the pulse width of the switching signal SW by the amount indicated by the double-hatched part in FIG. 3 by the amount of reduction of the pulse width of the switching signal indicated by the diagonally-hatched part in FIG. 3. Thereby, it is possible to shorten the minimum pulse width, or the minimum on-time, of the switching signal SW.

In each of the switching regulator 101 according to the first embodiment and the switching regulator 100 according to the comparative example, the operation of the slope circuit 3 and the operation of the RS flip-flop 6 may be changed. Specifically, the slope circuit 3 makes each time at which the clock signal CLK is switched from low level to high level a timing at of initializing the slope voltage $V_{SLP}$ and starting the sloping of the slope voltage $V_{SLP}$. Also, the RS flip-flop 6 switches the switching signal SW from low level to high level when the set signal is switched from low level to high level, and switches the switching signal SW from high level to low level when the reset signal is switched from low level to high level.

Figure 4:
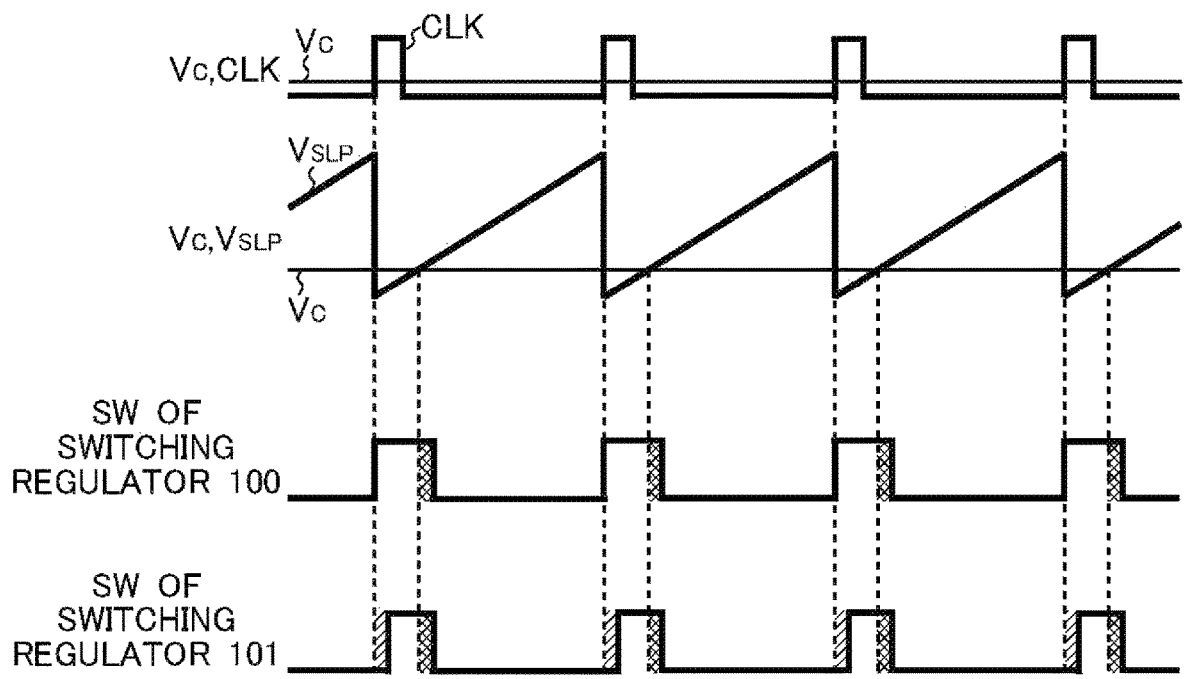
FIG. 4 is a time chart illustrating a modified example of the operations of the switching regulators illustrated in FIG. 1 and FIG. 2.

In a case where the operation of the slope circuit 3 and the operation of the RS flip-flop 6 are changed as described above, the switching regulator 101 according to the first embodiment and the switching regulator 100 according to the comparative example operate as illustrated in the time chart of FIG. 4. In the case where the operation of the slope circuit 3 and the operation of the RS flip-flop 6 are changed as described above, too, in the switching regulator 101 according to the first embodiment, it is possible to reduce the increase of the pulse width of the switching signal SW by the amount indicated by a double-hatched part in FIG. 4, by an amount of reduction of the pulse width of the switching signal SW indicated by a diagonally-hatched part in FIG. 4. Thereby, it is possible to shorten the minimum pulse width, or the minimum on-time, of the switching signal SW.

Second Embodiment

Figure 5:
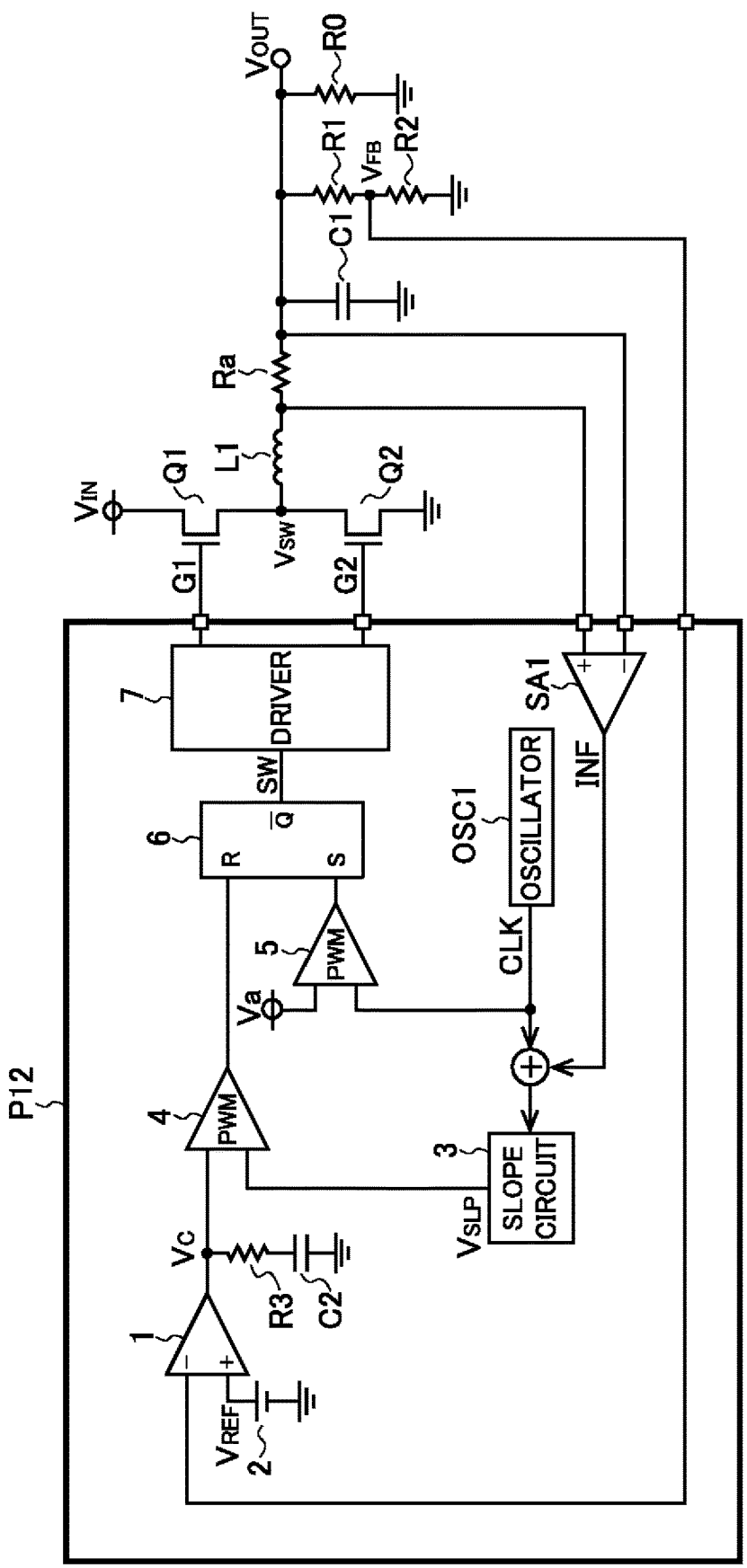
FIG. 5 is a diagram illustrating a configuration of a second embodiment of the switching regulator.

FIG. 5 is a diagram illustrating a configuration of a second embodiment of the switching regulator. A switching regulator 102 according to the second embodiment and the switching regulator 101 according to the first embodiment are different from each other only in terms of the configuration of the semiconductor integrated circuit package.

A semiconductor integrated circuit package P12 in the switching regulator 102 according to the second embodiment and the semiconductor integrated circuit package P11 in the switching regulator 101 according to the first embodiment are different from each other only in terms of the voltage to be compared with the clock signal CLK by the comparator 5.

In the semiconductor integrated circuit package P11, the comparator 5 compares the clock signal CLK with the error signal Vc having undergone the phase compensation, but in the semiconductor integrated circuit package P12, it is a constant voltage Va that the comparator 5 compares with the clock signal CLK. The constant voltage Va may be generated inside the semiconductor integrated circuit package P12, or may be generated outside the semiconductor integrated circuit package P12 and then supplied to the semiconductor integrated circuit package P12. The value of the constant voltage Va is adjusted, like in the case where the error signal Vc is used, such that the output signal of the comparator 5 becomes low level when the clock signal CLK is at low level, and the output signal of the comparator 5 becomes high level when the clock signal CLK is at high level. Here, provided that the output signal of the comparator 5 becomes low level when the clock signal CLK is at low level, and the output signal of the comparator 5 becomes high level when the clock signal CLK is at high level, it is possible to use a variable voltage instead of the constant voltage Va.

Like in the switching regulator 101 according to the first embodiment, in the switching regulator 102 according to the second embodiment, too, it is possible reduce the increase of the pulse width of the switching signal SW due to the delay at the comparator 4 by an amount of reduction of the pulse width of the switching signal SW due to the delay at the comparator 5. Thereby, it is possible to shorten the minimum pulse width, or the minimum on-time, of the switching signal SW.

However, in the switching regulator 102 according to the second embodiment, it is the error signal Vc having undergone the phase compensation that is compared with the slope voltage $V_{SLP}$ by the comparator 4, and it is the constant voltage Va that is compared with the clock signal CLK by the comparator 5; that is, the comparator 4 and the comparator 5 operate at different operating points. On the other hand, in the switching regulator 101 according to the first embodiment, it is the error signal Vc having undergone the phase compensation that is compared with the slope voltage $V_{SLP}$ by the comparator 4, and it is also the error signal Vc having undergone the phase compensation that is compared with the clock signal CLK by the comparator 5; that is, the comparator 4 and the comparator 5 operate at the same operating point. This makes the switching regulator 101 according to the first embodiment superior to the switching regulator 102 according to the second embodiment in increasing the degree of agreement between the amount of increase of the pulse width of the switching signal SW due to the delay at the comparator 4 and the amount of reduction of the pulse width of the switching signal SW due to the delay at the comparator 5.

Third Embodiment

Figure 6:
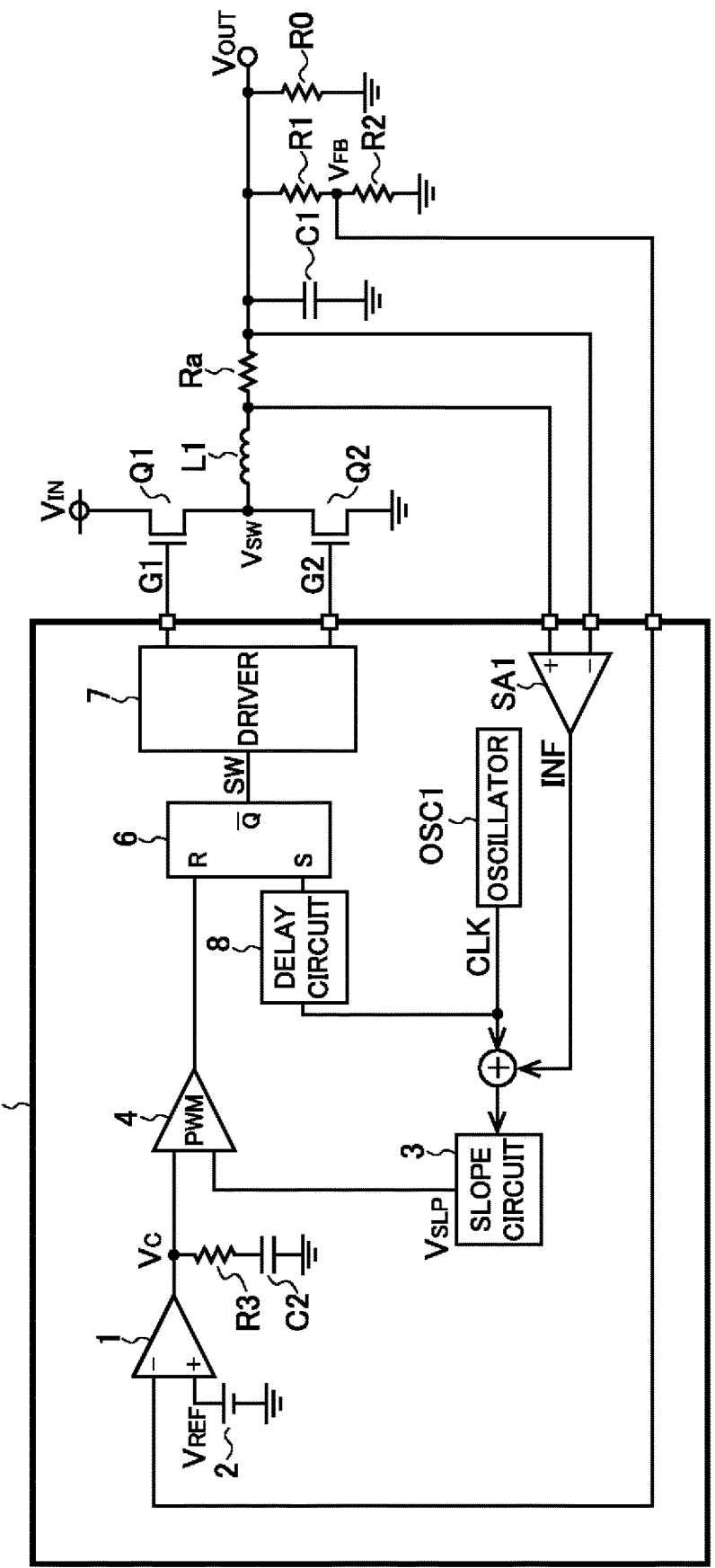
FIG. 6 is a diagram illustrating a configuration of a third embodiment of the switching regulator.

FIG. 6 is a diagram illustrating a configuration of a third embodiment of the switching regulator. A switching regulator 103 according to the third embodiment and the switching regulator 101 according to the first embodiment are different from each other only in terms of the configuration of the semiconductor integrated circuit package.

A semiconductor integrated circuit package P13 of the switching regulator 103 according to the third embodiment and the semiconductor integrated circuit package P11 of the switching regulator 101 according to the first embodiment are different from each other in that the comparator 5 used in the semiconductor integrated circuit package P11 is replaced with a delay circuit 8 in the semiconductor integrated circuit package P13.

The delay circuit 8 outputs the clock signal CLK with a delay. There is no particular limitation on the circuit configuration of the delay circuit 8, and, a CR delay circuit, which is commonly used, may be used as the delay circuit 8, for example. The amount of delay at the delay circuit 8 is adjusted to be close to the amount of delay at the comparator 4.

In the switching regulator 103 according to the third embodiment, it is possible to reduce the amount of increase of the pulse width of the switching signal SW due to the delay at the comparator 4 by the amount of reduction of the pulse width of the switching signal SW due to the delay at the delay circuit 8. Thereby, it is possible to shorten the minimum pulse width, or the minimum on-time, of the switching signal SW. Although it depends on how elaborately the delay circuit 8 is built, but generally, the degree of agreement is higher between the amount of increase of the pulse width of the switching signal SW due to the delay at the comparator 4 and the amount of reduction of the pulse width of the switching signal SW due to the delay at the comparator 5 than between the amount of increase of the pulse width of the switching signal SW due to the delay at the comparator 4 and the amount of reduction of the pulse width of the switching signal SW due to the delay at the delay circuit 8.

<Uses>

Figure 7:
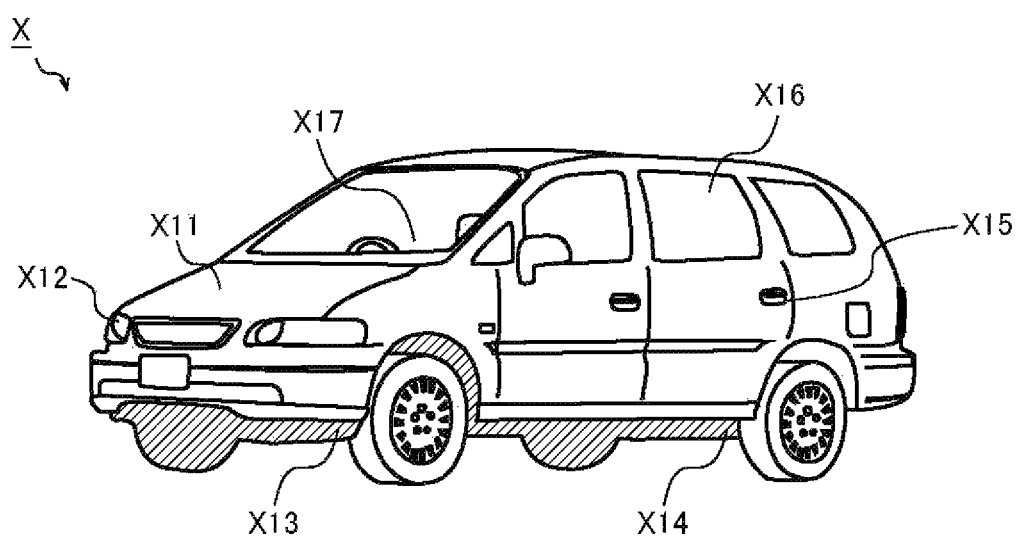
FIG. 7 is an appearance diagram illustrating a structure example of a vehicle incorporating in-vehicle apparatuses.

Next, examples of uses for the above-described switching regulators 101 to 103 will be described. FIG. 7 is an appearance diagram illustrating a structure example of a vehicle incorporating in-vehicle apparatuses. A vehicle X having the present structure has mounted therein a battery (not shown), a primary switching regulator (not shown) to which a direct-current voltage supplied from the battery is fed, a secondary switching regulator (not shown) into which a direct-current voltage outputted from the primary switching regulator is fed, and in-vehicle apparatuses X11 to X17. The primary switching regulator is supplied with power directly from the battery, and the secondary switching regulator is supplied with power indirectly (via the primary switching regulator) from the battery. The switching regulators 101 to 103 described above are each applicable to the primary switching regulator or the secondary switching regulator.

The in-vehicle apparatuses X11 to X17 each use the output voltage of either the primary switching regulator or the secondary switching regulator as a power-supply voltage.

The in-vehicle apparatus X11 is an engine control unit which performs engine-related control (including injection control, electronic throttle control, idling control, oxygen sensor heater control, and auto cruise control).

The in-vehicle apparatus X12 is a lamp control unit which performs turning on/off control of an HID [high intensity discharged lamp], a DRL [daytime running lamp], etc.

The in-vehicle apparatus X13 is a transmission control unit which performs transmission-related control.

The in-vehicle apparatus X14 is a body control unit which performs control (including ABS [anti-lock brake system] control, EPS [electric power Steering] control, and electronic suspension control) related to movement of the vehicle X.

The in-vehicle apparatus X15 is a security control unit which performs driving control of a door lock, a security alarm, etc.

The in-vehicle apparatus X16 an electronic apparatus that is built in the vehicle X on the factory shipment stage as standard equipment or car-maker's option equipment, such as a wiper, an electric door mirror, a power window, an electric sunroof, an electric seat, an air conditioner, etc.

The in-vehicle apparatus X17 is an electronic apparatus mounted in the vehicle X as the user desires, such as a vehicle A/V [audio/visual] apparatus, a car navigation system, an ETC [Electronic Toll Collection System], etc.

Other Modified Examples

Besides the above embodiments, it is possible to add various modifications to the configuration of the present invention without departing from the spirit of the present invention.

For example, the above-described embodiments have dealt with a step-down switching regulator as an example, but the switching regulator may instead be a step-up switching regulator or a step-up/down switching regulator.

The switching regulators 101 to 103 described in the above embodiments each include a delay portion (the comparator 5 or the delay circuit 8) to which the clock signal CLK is fed, but they may instead be a switching regulator configured such that, without being provided with a delay portion, the timing at which the latch portion is set is delayed with respect to the timing at which the sloping of the slope voltage starts.

For example, by changing the operation of the slope circuit 3 and the operation of the RS flip-flop 6 in the switching regulator 100 according to the comparative example illustrated in FIG. 2, it is possible to obtain a configuration where the timing at which the latch portion (the RS flip-flop 6) is set is delayed with respect to the timing at which the sloping of the slope voltage starts. The switching regulator 100 where the operation of the RS flip-flop 6 is thus changed will be referred to as a switching regulator 100' for the sake of convenience.

Figure 8:
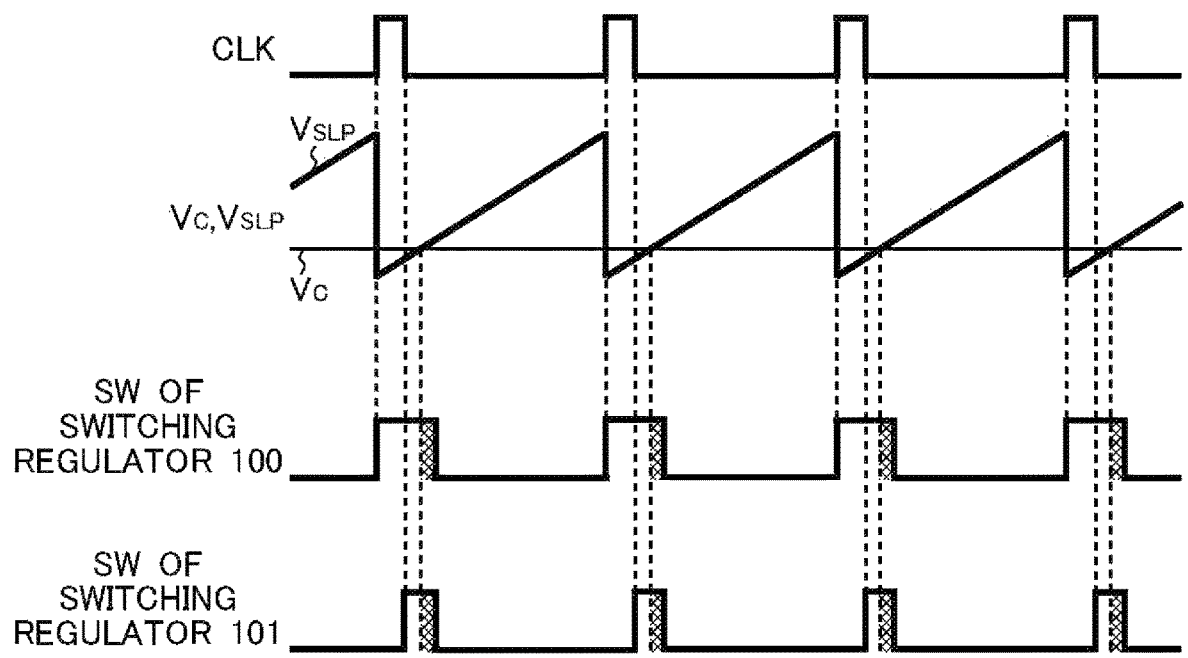
FIG. 8 is a time chart illustrating another modified example of the operation of the switching regulator illustrated in FIG. 2.

In the switching regulator 100', each time the clock signal CLK is switched from low level to high level, the slope circuit 3 is initialized and the sloping of the slope voltage $V_{SLP}$ starts. Further, when the set signal is switched from high level to low level, the RS flip-flop 6 switches the switching signal SW from low level to high level, and when the reset signal is switched from low level to high level, the RS flip-flop 6 switches the switching signal SW from high level to low level. This makes it possible for the switching regulator 100' to shorten the minimum pulse width, or the minimum on-time, of a switching signal SW as illustrated in FIG. 8. Note that the switching signal SW of the switching regulator 100 illustrated as the comparative example in FIG. 8 is the same as the switching signal SW of the switching regulator 100 illustrated in FIG. 4.

Thus, it should be considered that the above embodiments are examples in all respects and are not limiting, and that the technical scope of the present invention is not indicated by the above description of the embodiments but by the claims, and all modifications within the scope of the claims and the meaning equivalent to the claims are covered.

INDUSTRIAL APPLICABILITY

The present invention is usable in switching regulators used in all fields (the home appliance field, the automobile field, the industrial machinery field, etc.).

LIST OF REFERENCE SIGNS

1 error amplifier
2 reference voltage source
3 slope circuit
4, 5 comparator
6 RS flip-flop
7 driver
100, 100', 101 to 103 switching regulator
C1 output capacitor
C2 capacitor
L1 inductor
OSC1 oscillator
P10 to P13 semiconductor integrated circuit package
Q1, Q2 MOS transistor
R0 output resistance
R1, R2 voltage dividing resistor
R3 resistor
Ra current detecting resistor
SA1 current detection amplifier
X vehicle
X11 to X17 in-vehicle apparatus

The invention claimed is:

1. A switching regulator control circuit comprising:
a slope voltage generator configured to generate a slope voltage based on a clock signal of a predetermined frequency;
an error amplifier configured to generate an error signal corresponding to a difference between a voltage corresponding to an output voltage of a switching regulator and a reference voltage;
a first comparator configured to compare the slope voltage with the error signal both inputted to the first comparator for outputting a comparison signal;
a latch portion configured to be set based on the clock signal and reset by the comparison signal outputted from the first comparator; and
a delay portion configured to output a set signal for setting the latch portion based on the clock signal with a delay adjusted to be close to a delay in the first comparator outputting the comparison signal from time point at which the level relation between the inputted error signal and the inputted slope voltage is switched.

2. The switching regulator control circuit according to claim 1, wherein the delay portion is fed with the clock signal, and wherein an output signal of the delay portion is supplied to a set terminal of the latch portion.

3. A switching regulator control circuit comprising:
a slope voltage generator configured to generate a slope voltage based on a clock signal of a predetermined frequency;
an error amplifier configured to generate an error signal corresponding to a difference between a voltage corresponding to an output voltage of a switching regulator and a reference voltage;
a first comparator configured to compare the slope voltage with the error signal; and
a latch portion configured to be set based on the clock signal and reset by an output signal of the first comparator,
wherein a timing at which the latch portion is set is delayed with respect to a timing at which sloping of the slope voltage,
wherein the switching regulator control circuit further comprises a delay portion to which the clock signal is fed,
wherein an output signal of the delay portion is supplied to a set terminal of the latch portion, and
wherein the delay portion is a second comparator configured to compare the clock signal with a predetermined voltage.

4. The switching regulator control circuit according to claim 3, wherein the predetermined voltage is the error signal.

5. The switching regulator control circuit according to claim 3, wherein the predetermined voltage is a constant voltage.

6. The switching regulator control circuit according to claim 1, wherein
the slope voltage generator receives a result of detection performed by a current detector configured to detect a current flowing in the inductor which is provided in the switching regulator, and
the slope voltage is a voltage corresponding to the result of detection performed by the current detector.

7. The switching regulator control circuit according to claim 1, wherein the latch portion is set at one of a first inversion timing at which the clock signal is inverted from low level to high level and a second inversion timing at which the clock signal is inverted from high level to low level, and the sloping of the slope voltage starts at another of the first inversion timing and the second inversion timing.

8. A switching regulator comprising:

the switching regulator control circuit according to claim 1; and a switching element configured to be turned on/off by the switching regulator control circuit.

9. A vehicle comprising:

the switching regulator according to claim 8; and a battery configured to supply power to the switching regulator.

10. A switching regulator comprising:

the switching regulator control circuit according to claim 3; and a switching element configured to be turned on/off by the switching regulator control circuit.

11. A vehicle comprising:

the switching regulator according to claim 10; and a battery configured to supply power to the switching regulator.

* * * * *